United States Patent

[11] 3,604,836

[72] Inventor Ralph E. Pierpont
Kennebunk, Maine

[21] Appl. No. 855,897
[22] Filed Sept. 8, 1969
[45] Patented Sept. 14, 1971

[73] Assignee Sprague Electric Company
North Adams, Mass.

[54] DIP-COATED ELECTRICAL COMPONENTS
3 Claims, 2 Drawing Figs.

[52] U.S. Cl. .......... 174/52 PE, 317/101 CC
[51] Int. Cl. .......... H05h 5/00
[50] Field of Search .......... 313/317, 331; 174/50.52, 50.56, 52.5, 52.6, 50.51, 152.4; 339/17; 317/101 C, 101 CC

[56] References Cited

UNITED STATES PATENTS

| | | | |
|---|---|---|---|
| 3,107,757 | 10/1963 | Breadner | 174/152 (.4) UX |
| 3,264,015 | 8/1966 | Mayers | 174/50.56 X |
| 3,331,912 | 7/1967 | Stricker | 174/50.52 |

FOREIGN PATENTS

| | | | |
|---|---|---|---|
| 928,614 | 6/1963 | Great Britain | 174/152 (.4) |

*Primary Examiner*—Darrell L. Clay
*Attorneys*—Connolly and Hutz, Vincent H. Sweeney, James Paul O'Sullivan and David R. Thornton

ABSTRACT: Solder globules applied to lead wires for dipped electrical components act as reference points and barriers in dipping, and as standoffs and soldering assists for circuit board mounting.

PATENTED SEP 14 1971 3,604,836

DIP-COATED ELECTRICAL COMPONENTS

BACKGROUND OF THE INVENTION

This invention relates to dip-coated electrical components, and more particularly to improvements in the mechanical strength and uniformity of such components.

The weakest points of coated electrical components are areas where the lead wires contact the insulating material which forms the coating. The insulating material has a tendency to be drawn some length along the lead wires. This action produces between the two lead wires, a coating much thinner and weaker than at any other area on the encapsulated component. It is also usually the case that the insulative material is drawn too far along the lead wire and must be mechanically cut back, with the resultant increase in the possibility of having an imperfect seal and an absorption of moisture. Metallic silver, a favored electrode material, migrates from the anode to the cathode of electrical components in the presence of moisture. Other disadvantages leading to component failure because of the presence of moisture are well known to those skilled in the art and need not be chronicled here.

Attempts of the prior art to solve the above-mentioned problems have proven to be too cumbersome and uneconomical to pursue to any length.

The large scale use of circuit boards has presented the problem of mounting electrical components above the surface of the board rather than directly on it, such that certain necessary washings and other processes to the board itself, may in no way contaminate the components. Prior art has overcome this problem by the use of standoffs. It is an advantage of this invention that it introduces a novel standoff device for the purposes enumerated above, and further that it carries to a more complete stage the soldering operation necessary to mount the electrical components.

It is an object of this invention to improve the mechanical strength and uniformity of electrical components.

More particularly an object of this invention is the strengthening of the area of lead wire-insulative coating junction.

It is also an object of this invention to provide a novel component standoff means and a solder assist in the mounting operation.

SUMMARY OF THE INVENTION

On lead wires extending from electrical components, globules made of solder are applied at predetermined locations in close proximity to the electrical component. These globules act as resin-dip barriers and reference points, preventing the resin from running along the lead wires and allowing it instead to fill between the wires. The globules also serve as standoffs during the mounting operation on a circuit board. They keep the component a set distance above the surface of the board, the distance being determined by the location of the globules on the lead wire. Further, the globules act as assists in the soldering by rendering some of their solder to that operation to more completely fill the holes in the circuit board.

DESCRIPTION OF THE PREFERRED EMBODIMENTS

Figure 1:
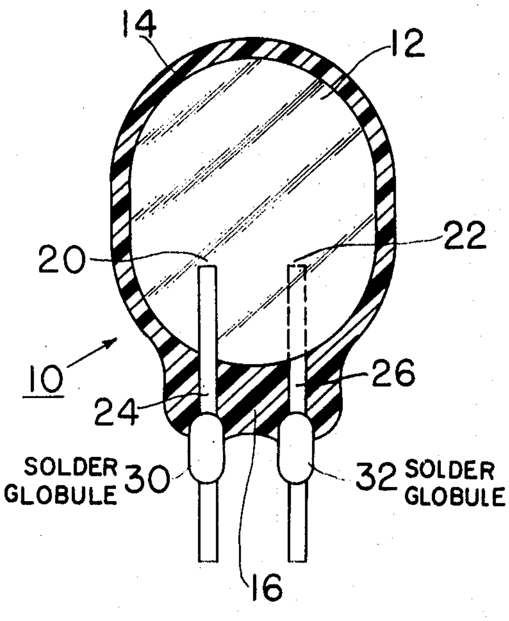
FIG. 1 is a view in section of an electrical component in accordance with the present invention.

FIG. 1 illustrates an electrical component 10 prepared in accordance with the present invention. Said component comprises an electrical element 12 with metallic electrodes 20 and 22 connected to lead wires 24 and 26, respectively. The aggregate articles of said component 10 have an insulative resinous coating 14 surrounding them, with a particularly thick fill 16 between said lead wires 24 and 26. Applied to said lead wires 24 and 26 are solder globules 30 and 32, respectively.

Figure 2:
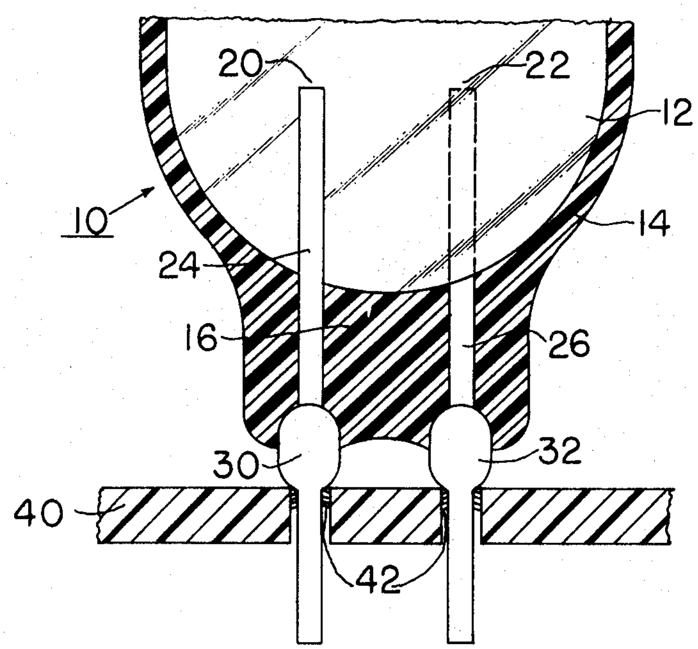
FIG. 2 is a fragmentary view in section of the component of FIG. 1, illustrating engagement of the leads with a circuit board.

FIG. 2 shows the invention of FIG. 1 in actual use. Electrical component 10 is attached to circuit board 40 with solder globules 30 and 32 acting as standoffs and soldering assists in the mounting operation. Said globules 30 and 32 keep said component 10 a certain distance above the surface of said board 40, the distance being variably adjustable according to the point of solder application. Said globules 30 and 32 further aid the mounting operation by rendering some of their solder to the soldering operation thus more completely filling the holes 42 in said circuit board 40. It is important to note that only some of the solder is used, and the qualities of the globules 30 and 32 as standoffs and seals are in no way affected.

In normal resin dipping, the insulative coating of the electrical component is dangerously thin between the lead wires and is also too often drawn up the lead wires to a point where it must be mechanically cut back; both situations being potential areas of component failure. In the embodiment of the present invention, solder globules 30 and 32 act as resin-dip barriers preventing the insulative coating material 14 from being drawn up lead wires 24 and 26 and permitting a sufficiently thick fill 16 to be built up by interfacial tension between said lead wires 24 and 26, such that the disadvantages attendant on above enumerated problems are eliminated.

It is believed that in promoting the resin fill between the lead wires, the globules interrupt the wicking effect by converting the vertical lead surface to a local horizontal surface. Further two horizontal surfaces, adjacent to each other, will support a column of resin as the mass of the column is held up by resin surface tension. In this respect, the globules are acting similarly to the hanging drop phenomena on a burette or the column of material supported by the ring in a de Nuoy tensiometer.

Solid tantalum and ceramic disc capacitors serve as specific illustrations of the invention, but any encapsulated electrical component having lead wires could serve equally as well. The insulative coating material for solid tantalum capacitors is an epoxy resin commercially available as "Epon." Ceramic disc capacitors are coated with a phenolic resin available under the trade name "Durez."

The solder globules can be applied in a number of ways, and in addition to serving as resin-dip barriers, they act also as reference points for dipping. Liquid solder can be applied by dropping to a moving tray of lead wires; preformed solder rings can be slipped on the leads to a rack or frame stop and then heated; or solder may be cast or molded around the lead wires in a jig. All three of these methods of application are acceptable and allow the controllability necessary to the placement of the globules in close proximity to the electrical component itself.

Although solder has been offered as the specific example for globules attached to the lead wires, other material, such as epoxies or phenols, may be used with many, but not all, of the advantages of the solder globule resulting.

What is claimed is:

1. A dipped electrical component comprising at least one electrical element, at least one pair of leads attached to said element and extending from it in a planar relationship, each of said leads having a solder globule applied at a predetermined location spaced from said element on said extending portions, a resin coating covering said element and said leads to said globules, said coating substantially filling the area between said element and said globules, said globules forming resin-dip barriers during the encapsulation process.

2. The electrical component of claim 1 wherein said locations are in close proximity to said electrical element such that interfacial tension causes a more complete resin fill in said area.

3. The electrical component of claim 1 wherein said leads are inserted in a circuit board, and the bottoms of said globules extend beyond said coating such that said globules act as component standoffs and solder assists in circuit board mounting operations, said leads being soldered to conductors on said circuit board.